US006486391B2

(12) United States Patent
Karg

(10) Patent No.: US 6,486,391 B2
(45) Date of Patent: Nov. 26, 2002

(54) DIODE STRUCTURE, ESPECIALLY FOR THIN-FILM SOLAR CELLS

(75) Inventor: Franz Karg, Munich (DE)

(73) Assignee: Siemens and Shell Solar GmbH (NL)

(*) Notice: Subject to any disclaimer, the term of this patent is extended or adjusted under 35 U.S.C. 154(b) by 0 days.

(21) Appl. No.: 09/915,142

(22) Filed: Jul. 25, 2001

(65) Prior Publication Data

US 2002/0043279 A1 Apr. 18, 2002

Related U.S. Application Data

(63) Continuation of application No. PCT/EP00/10265, filed on Oct. 18, 2000.

(30) Foreign Application Priority Data

Nov. 25, 1999 (DE) ............................................. 19956735

(51) Int. Cl.⁷ ................... H01L 31/032; H01L 31/0336; H01L 31/072
(52) U.S. Cl. ....................... 136/252; 136/262; 136/265; 257/43; 257/184; 257/461; 257/464
(58) Field of Search ................................. 136/252, 262, 136/265; 257/43, 184, 461, 464

(56) References Cited

U.S. PATENT DOCUMENTS

| 4,094,751 A | * | 6/1978 | Nozik ......................... 205/638 |
| 4,703,131 A | | 10/1987 | Dursch |
| 5,626,688 A | | 5/1997 | Probst et al. |
| 5,676,766 A | | 10/1997 | Probst et al. |

FOREIGN PATENT DOCUMENTS

| WO | WO 92/20103 A1 | | 11/1992 |
| WO | WO 92/20103 A1 | * | 11/1992 |

OTHER PUBLICATIONS

MD Mosaddeq–Ur–Rahman et al., "Novel Low–Cost Solid–State Heterojunction Solar Cell Based on TI02 and its Modification for Improved Efficiency," Japanese Journal of Applied Physics, JP Publication Office Japanese Journal of Applied Physics, Tokyo, vol. 35, No. 6A, Jun. 1996, pp. 3334–3342.

Krishna K M et al., "Investigation of solid state Pb doped TiO2 solar cell" Solar Energy Materials and Solar Cells, NL, Elsevier Science Publishers, Amsterdam, vol. 48, No. 1–4, Nov. 1, 1997, pp. 123–130.

Guillen C. et al., "Cathodic Electrodeposition of $CuInSe_2$ Thin Films," Thin Solid Films, Ch, Elsevier–Sequoia S.A. Lausanne, vol. 195, No. 1/2, 1991, pp. 137–146.

Rahman et al, "Novel Low–Cost Solid–State Heterojunction Solar Cell Based on TiO2 and its Modification for Improved Efficiency," Jpn. J. Appl. Phys., vol. 65, No. 6A, pp. 3334–3342, Jun. 1996.*

Tokio Nakada and Akio Kunioka, "Polycrystalline Thin–Film $TiO_2$/Se Solar Cells," Japanese Journal of Applied Physics, vol. 24, No. 7, Jul. 1985, pp. L536–L538.

* cited by examiner

Primary Examiner—Alan Diamond
(74) Attorney, Agent, or Firm—Wolf, Greenfield & Sacks, P.C.

(57) ABSTRACT

The invention relates to a diode structure, especially for thin film solar cells. The aim of the invention is to provide a diode structure for thin film solar cells. Said structure allows for an assembly of a thin film solar cell, whereby said assembly is as flexible as possible, efficiency is high, and utilizing materials that are as environmentally friendly as possible. A diode structure comprising a p-conducting layer, which consists of a chalcopyrite compound, and a n-conducting layer, which is adjacent to the p-conducting layer and consists of a compound that contains titanium and oxygen, is provided.

16 Claims, 4 Drawing Sheets

DIODE STRUCTURE, ESPECIALLY FOR THIN-FILM SOLAR CELLS

RELATED APPLICATIONS

This application is a continuation of International Patent Application Ser. No. PCT/EP00/10265, filed Oct. 18, 2000, and published in German on May 31, 2001, which claims foreign priority benefits under 35 U.S.C. §119(a)–(d) or 35 U.S.C. §365(b) of German application number DE19956735.2, filed Nov. 25, 1999.

FIELD OF THE INVENTION

The invention relates to a diode structure, especially for use for thin-film solar cells.

BACKGROUND OF THE INVENTION

Thin-film solar cells on the basis of polycrystalline semiconductors offer good chances of significantly reducing the costs for producing rugged and highly efficient solar modules. Of all thin-film solar cells, those on the basis of chalcopyrite semiconductors feature hitherto highest efficiency and count as an interesting candidate for future low-cost solar current or photovoltaic systems. Chalcopyrite compounds in this respect include compounds of the group $Cu(InGa)(Sse)_2$, and more particularly copper indium diselenide ($CuInSe_2$).

A typical layer structure of a chalcopyrite cell is shown in FIG. 4a. On the p-conducting chalcopyrite semiconductor, a CdS layer forms a heterojunction whose electrical field permits charge carrier separation. The front contact on top thereof is formed by a ZnO layer and the back contact is formed by a layer of molybdenum on an insulating substrate, such as e.g. glass.

Illustrated in FIG. 4b is the corresponding band diagram relative to the structure as shown in FIG. 4a, it being evident that the ZnO window layer comprises a substantially larger band gap. This prevents photogenerated charge carriers from being absorbed directly at the surface of the solar cell, and due to the high defect density, immediately recombining there. The heterostructure thus results in substantially greater penetration depths and higher photocurrent yield. This requires, however, that the p-conducting absorber and the n-conducting window layer are well adapted both structurally and electronically.

Window layers as known and tested in production are based on doped metal oxides such as e.g. ZnO, $SnO_2$ or $InSnO_2$ (ITO) generally termed transparent conductive oxides (TCO). Known TCO layers, however, are difficult to adapt with regard to lattice constant or electron affinity to chalcopyrite semiconductors. This is why directly combining these window layers with chalcopyrite absorbers has hitherto failed to yield high and reproducible solar cell efficiencies.

To improve adapting TCO and absorber, thin, i.e. only approx. 50 nm thick, buffer layers are usually inserted between absorber layer and window layer. Best electronic quality and high efficiency is achieved by a diode configuration consisting of a chalcopyrite absorber, CdS buffer layer, and ZnO front electrode, it being this solar cell structure that, by far, achieves the highest efficiency of all thin-film solar cells (up to 18.8%). In addition, this solar cell structure features maximum process tolerance with regard to layer thickness and thus the high yield in production.

However, due to the CdS buffer layer, chalcopyrite semiconductors hitherto most successful contain heavy metals which complicate production and disposal.

SUMMARY OF THE INVENTION

It is thus the objective of the invention to provide a diode structure for thin-film solar cells achieving a configuration of the thin-film solar cell as simple as possible for high efficiency in using materials offering good environmental compatibility.

According to one embodiment of the invention, a diode structure for thin-film solar cells comprises a p-conducting layer comprising a chalcopyrite compound. The diode structure further comprises a n-conducting layer having a first band gap, the n-conducting layer further comprising a compound, the compound containing titanium and oxygen. The n-conducting layer adjoins the p-conducting layer The diode structure also comprises a n-conducting amplifying layer having a second band gap. Further, according to this embodiment, a side of the n-conducting layer facing away from the p-conducting layer adjoins the n-conducting amplifying layer, and the second band gap is larger than the first band gap.

According to one aspect of some embodiments of the invention, the chalcopyrite compound is a I-III-VI$_2$ semiconductor from the group $Cu(InGa)(SSe)_2$.

According to another aspect of some embodiments of the invention, the chalcopyrite compound comprises $CuInSe_2$ (CIS).

According to another aspect of some embodiments of the invention, the compound containing titanium and oxygen is selected from a group $TiO_x$ where x is in the range from greater than 1.5 to less than 2.0.

According to another aspect of some embodiments of the invention, the compound containing titanium and oxygen is selected based on the chalcopyrite compound, so as to achieve a best possible adaptation in a conduction band.

According to another aspect of some embodiments of the invention, the n-conducting amplifying layer comprises an oxide that is transparent and conductive.

According to another aspect of some embodiments of the invention, the oxide is a doped metal oxide.

According to another aspect of some embodiments of the invention, the oxide comprises any one of ZnO, $SnO_2$ and $InSnO_2$.

According to another embodiment of the invention, a thin-film solar cell comprises a diode structure. The thin-film solar cell comprises a p-conducting layer comprising a chalcopyrite compound. The thin-film solar cell further comprises a n-conducting layer having a first band gap, the n-conducting layer further comprising a compound, the compound containing titanium and oxygen. The n-conducting layer adjoining the p-conducting layer The thin-film solar cell also comprises a n-conducting amplifying layer having a second band gap. Further, according to this embodiment, a side of the n-conducting layer facing away from the p-conducting layer adjoins the n-conducting amplifying layer, and the second band gap is larger than the first band gap.

According to one aspect of some embodiments of the invention, a layer thickness of the n-conducting layer is selected based on a sheet resistivity of the n-conducting layer.

According to another aspect of some embodiments of the invention, a side of the p-conducting layer facing away from the n-conducting layer adjoins a bus contact.

According to another aspect of some embodiments of the invention, the n-conducting amplifying layer adjoins a substrate, the n-conducting amplifying layer facing away from a light incident side of the substrate.

According to another aspect of some embodiments of the invention, the bus contact comprises molybdenum.

According to another aspect of some embodiments of the invention, the bus contact is configured as a full surface area back electrode.

According to another aspect of some embodiments of the invention, the bus contact adjoins a light incident side of a substrate.

According to another aspect of some embodiments of the invention, the substrate comprises glass.

Other advantages, novel features, and objects of the invention will become apparent from the following detailed description of the invention when considered in conjunction with the accompanying drawings, which are schematic and which are not intended to be drawn to scale. In the figures, each identical, or substantially similar component that is illustrated in various figures is represented by a single numeral or notation. For purposes of clarity, not every component is labeled in every figure, nor is every component of each embodiment of the invention shown where illustration is not necessary to allow those of ordinary skill in the art to understand the invention.

BRIEF DESCRIPTION OF THE DRAWINGS

The invention will now be detailed by way of various example embodiments with reference to the drawing in which.

Figure 4A:
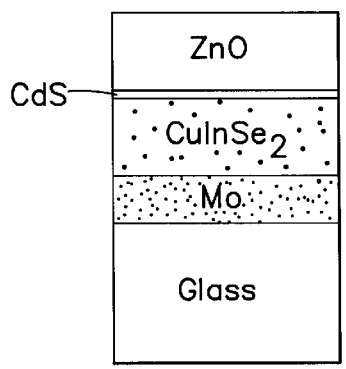
FIG. 4 is a diagrammatic view of the structure and band diagram of a conventional CIS thin-film solar cell including a thin CdS buffer layer.
Figure 4B:
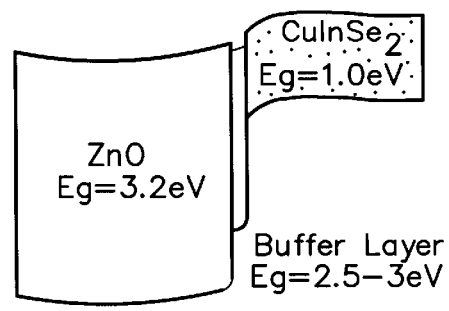
Figure 5:
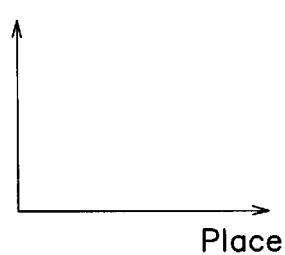
FIG. 5 is a band diagram of a conventional cadmium-free CIS thin-film solar cell including a ZnSe buffer layer.
Figure 5:
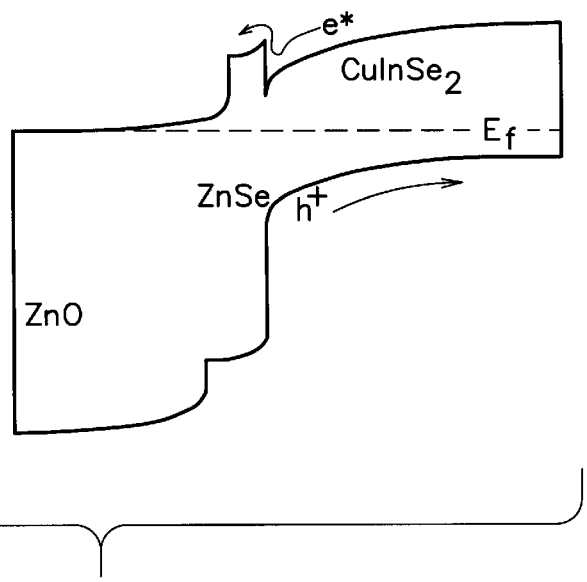

Reference has already been made to FIGS. 4 and 5 in the background description.

DETAILED DESCRIPTION

The diode structure in accordance with the invention comprises a p-conducting layer consisting of a chalcopyrite compound and, adjoining the p-conducting layer, an n-conducting layer consisting of titanium and oxygen. It has been discovered that a compound containing titanium and oxygen as the n-conducting layer permits good adaptation to a p-conducting layer consisting of a chalcopyrite compound. More particularly, this also permits achieving good adaptation in the conduction band, as a result of which the electron flow is improved.

In one preferred embodiment it is provided for that the chalcopyrite compound is a I-III-VI semiconductor of the group $Cu(InGa)(SSe)_2$, it having been discovered that copper indium diselenide ($CuInSe_2$) is particularly of advantage for use.

The compound containing titanium and oxygen preferably consists of a compound of the group $TiO_x$ with $1.5<x<2$. One criterion in selecting the compound from the group $TiO_x$ is with respect to the chalcopyrite compound employed that would result in achieving the best possible adaptation in the conduction band.

Due to the simple structure and good adaptation, the diode structure in accordance with the invention is already suitable in itself for use as a pn junction in solar cells. In addition, it is a special advantage of the invention that the diode structure in accordance with the invention can be simply supplemented by an n-conducting amplifying layer, as a result of which, the diode structure can be further improved in its properties. In this arrangement the n-conducting amplifying layer adjoins the side of the n-conducting layer facing away from the p-conducting layer and comprises a greater band gap than the n-conducting layer. Preferably the n-conducting amplifying layer consists of a transparent and conductive oxide, such as e.g. a doped metal oxide, it having been discovered that $ZnO$, $SnO_2$ or $InSnO_2$ are particularly favorable in this respect.

It is due to this simple means of extension by an n-conducting amplifying layer that a cadmium-free window layer is provided, whereby in this case the n-conducting $TiO_x$ layer serves as a buffer layer for passivating the surface of the pn junction.

As compared to this, cadmium-free buffer or window layers are known hitherto including a chalcopyrite compound as the absorber layer in which ZnSe or ZnS are used as the buffer layer. The disadvantages of these known cadmium-free buffer layers is evident from the band diagram as shown in FIG. 5, namely that the ZnSe buffer layer results in a barrier in the conduction band which obstructs the electron flow from the absorber into the window layer at least when the buffer layer is excessively thick. An explanation for this is to be appreciated in the relatively low electron affinity of the ZnSe window layer as compared to the chalcopyrite absorbers. To solve this problem, relatively thin buffer layers consisting of ZnSe were hitherto selected to assist charge carrier transport via tunneling. However, such thin buffer layers are a problem to control in large surface technology and result in problems in reproducing the electrical characteristics of the solar cells.

Accordingly, the invention not only furnishes a particularly simple diode structure, it also permits in conjunction with a suitable n-conducting amplifying layer, a cadmium-free thin-film structure having efficiencies hitherto unattainable with a CdS layer as the heterojunction.

For structuring a thin-film solar cell having a diode structure in accordance with the invention, it is necessary, due to the low conductivity of the p-conducting chalcopyrite layer, that the side of the p-conducting chalcopyrite layer facing away from the n-conducting layer adjoins a bus contact which more particularly may be configured as a full surface area back electrode. On the basis of the barrier layer in accordance with the invention without an n-conducting amplifying layer, there are now two possibilities of design, namely substrate design and superstrate design. The substrate design is characterized by the back electrode adjoining a substrate facing away from the light incident side, whereas the superstrate design is characterized by the n-conducting layer adjoining a substrate which faces the light incident side. Although the superstrate configuration is more of a problem to fabricate, it is to be preferred as a rule, since in this case the cell is already protected from environmental harm at the light incident side.

One criterion for selecting the layer thickness of the n-conducting layer is to minimize the layer thickness to permit cost-effective production of $TiO_x$ electrodes by taking into account, more particularly, that the requirements on the sheet resistivity of the n-conducting layer vary as a function of the illumination conditions.

For example, the indoor illumination conditions are weaker than outdoors and thus the system can work with a lower sheet resistivity, permitting a corresponding reduction in the layer thickness of the $TiO_x$ electrode.

Depending on the particularly application, sheet resistivities in the range $1\Omega_2$ to $50\Omega_2$ have been discovered to be favorable, the sheet resistivity being defined by the ratio of specific resistance to layer thickness.

On the basis of a diode structure in accordance with the invention, boosted by an n-conducting amplifying layer, there are again two possibilities of designing such a barrier layer structure. Here again, the substrate design is characterized by the back electrode adjoining a substrate facing away from the light incident side, whereas the superstrate design is characterized by the n-conducting amplifying layer adjoining a substrate facing the light incident side.

In all cases it is good practice when the back electrode is made of molybdenum and the substrate of glass.

Referring now to FIG. 1, there is illustrated the layer structure of a thin-film solar cell including a barrier layer in accordance with the invention comprising a p-conducting layer consisting of a chalcopyrite compound and an n-conducting layer consisting of titanium and oxygen adjoining the p-conducting layer. There are two basic distinctions with regard to the categories of the layer structure, namely, for one thing, depositing the $TiO_x$ layer on an existing chalcopyrite layer (substrate design) and, for another, depositing the chalcopyrite layer on an existing $TiO_x$ surface (superstrate design). A wealth of different methods for depositing $TiO_x$ thin films are known from prior art, all of which are compatible, in principle, with the application in accordance with the invention. Although restrictions do exist with regard to the maximum permissible temperature for depositing the $TiO_x$ layer depending on the temperature limits of the underlying layers, otherwise undesirable interdiffusion effects, material degradation, and/or substrate distortions may occur. Accordingly, the deposition temperature for the substrate design is preferably below 400° C.

Figure 1A:
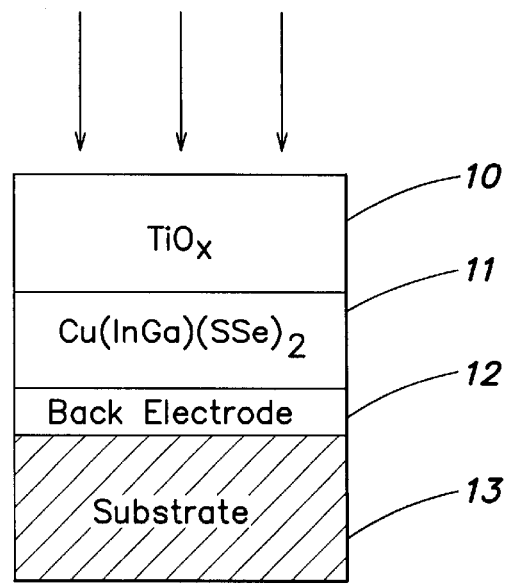
FIG. 1 is a diagrammatic view of the layer structure of a thin-film solar cell including a barrier layer in accordance with the invention in substrate design and superstrate design, as shown in FIGS. 1a and 1b respectively.

FIG. 1a shows a substrate 13 to which a back electrode 12 consisting of, for example, molybdenum is applied. The back electrode 12 is then supplemented by a chalcopyrite layer 11 and a titanium oxide layer 10, this being a substrate design, and thus the titanium oxide layer 10 faces the light incident side.

Figure 1B:
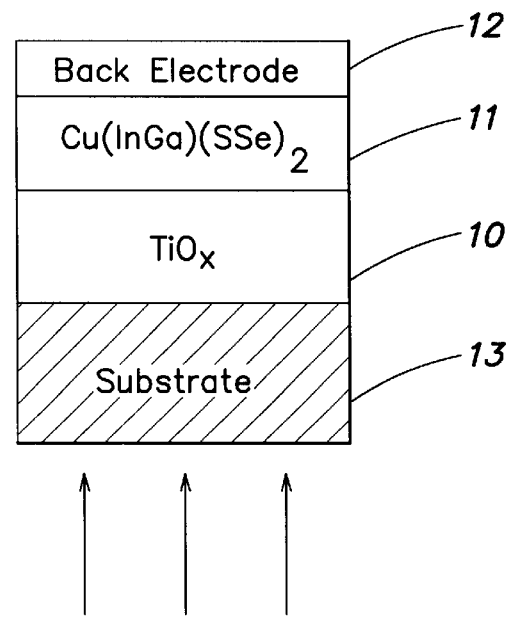

FIG. 1b shows a layer structure analogous to that as shown in FIG. 1a, except that in the superstrate design (FIG. 1b), a titanium oxide layer is applied to the substrate 13 which is followed by the chalcopyrite layer 11 and back electrode 12, resulting in light being incident at the substrate side.

In the layer structure as shown in FIGS. 1a and 1b, particular attention is needed to the conductivity achievable for the $TiO_x$ electrode depending on the desired application.

For example, in an application such as a terrestrial solar cell, a sheet resistivity of the front electrode of less than $20\Omega$ needs to be achieved.

For a usual module size, experience has shown that this can be satisfied for a $TiO_x$ conductivity exceeding 100 $(\Omega cm)^{-1}$, whereby the requirements on the conductivity of the front electrode are less under conditions of weak illumination (e.g. indoors) so that the system will work with a lower sheet resistivity where necessary.

Figure 2A:
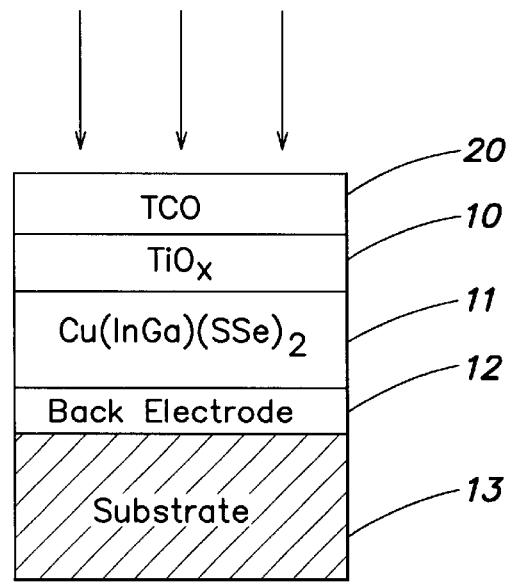
FIG. 2 is a diagrammatic view of the layer structure including a barrier layer in accordance with the invention comprising an additional amplifying layer in substrate design and superstrate design, as shown in FIGS. 2a and 2b respectively.

Should, however, the front electrode have a conductivity of less than 100 $(\Omega cm)^{-1}$ under normal conditions, then the front electrode should preferably be amplified by suitable transparent front electrode layers. One such structure including an n-conducting amplifying layer is shown in FIG. 2. $ZnO$, $SnO_2$ or $InSnO_2$ (ITO) or other doped metal oxides are suitable as transparent conductive oxides (TCO) layers for the amplifying layers. Accordingly, the layer structure as shown in FIG. 2a differs from that as shown in FIG. 1a by an additional TCO layer 20 being applied to the titanium oxide layer 10. Since the design in this case is a substrate design, the light is incident via the additionally deposited TCO layer.

Figure 2B:
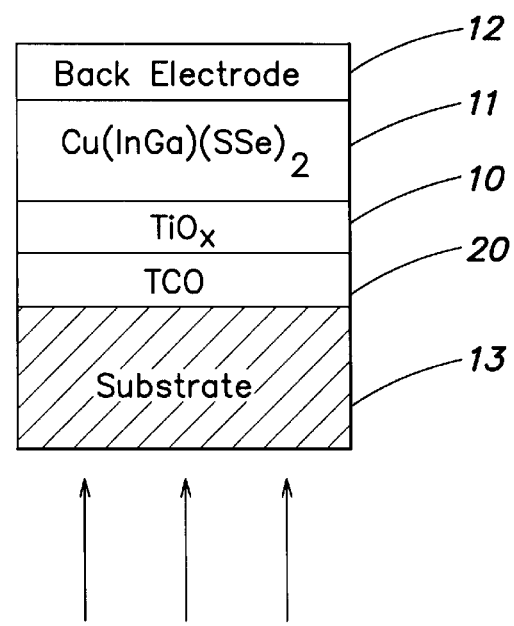

Referring now to FIG. 2b, there is illustrated how, as compared to applying the amplifying layer in the superstrate design as shown in FIG. 1b, the TCO layer is first applied to the substrate before the layer structure as known from FIG. 1b is made. Here again, the light is incident the same as in FIG. 1b via the substrate 13.

Figure 3:
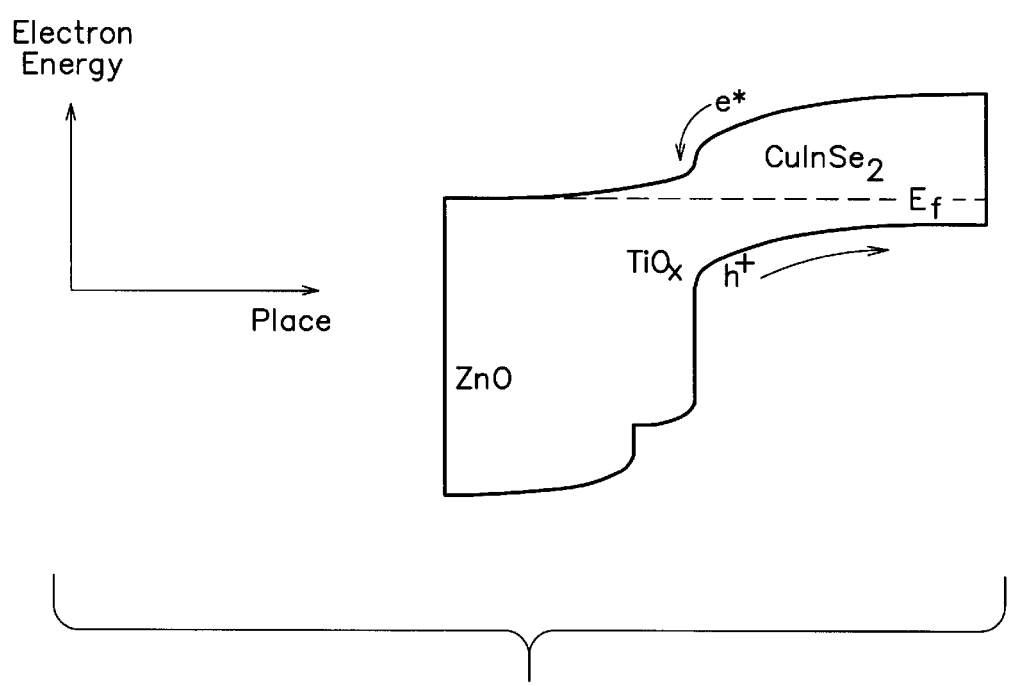
FIG. 3 is a band diagram of a barrier layer in accordance with the invention including an additional amplifying layer.

Referring now to FIG. 3, there is illustrated a band diagram of a barrier layer in accordance with the invention, including the layer structure as shown in FIG. 2. Adjoining the chalcopyrite layer is a $TiO_x$ layer which is amplified by a ZnO layer. The ZnO layer comprises a band gap even greater than that of the $TiO_x$ layer to ensure that photo generated charge carriers are not directly absorbed at the surface of the solar cell. In this case the titanium oxide layer has the task of a buffer layer between the ZnO layer and the chalcopyrite layer. Comparing this to the diagram as already described in FIG. 5, there is illustrated the special advantage afforded by the barrier layer structure in accordance with the invention, namely that, due to the high electron affinity of $TiO_x$ (approx. 4.3 eV) as compared to the ZnSe buffer layer as shown in FIG. 5, as used hitherto, the energetic barrier in the conduction band is substantially reduced, thus enhancing the electron flow, and therefore it is no longer necessary to thermally activate or to tunnel assist transport for the electron flow from the absorber in the direction of the front electrode.

While several embodiments of the invention have been described and illustrated herein, those of ordinary skill in the art may readily envision a variety of other structures for performing the functions and/or obtaining the results or advantages described herein, and each of such variations or modifications is deemed to be within the scope of the present invention. In addition, those skilled in the art may readily appreciate that all parameters, dimensions, materials, and configurations described herein are meant to be exemplary and that actual parameters, dimensions, materials, and configurations will depend upon specific applications for which the teachings of the present invention are used. Those skilled in the art may also recognize, or be able to ascertain using no more than routine experimentation, equivalents to the specific embodiments of the invention described herein. It is, therefore, to be understood that the foregoing embodiments are presented by way of example only and that, within the scope of the appended claims and equivalents thereto, the invention may be practiced otherwise than as specifically described. The present invention is directed to each individual feature, structure, combination of structures, system, and/or material described herein. In addition, any combination of two or more such features, structures, combination of structures, systems, and/or materials, provided that such features, systems, materials, structures, and/or combination of structures are not mutually in consistent, is included within the scope of the present invention. In the claims, all transitional phrases or phrases of inclusion, such as "comprising," "including," "carrying," "having," "containing," and the like are to be understood to be open-ended, i.e. to mean "including but not limited to." Only the transistional phrases or phrases of inclusion "consisting of," and "consisting essentially of," are to be interpreted as closed or semi-closed phrases, respectively, as set forth in MPEP section 2111.03.

What is claimed is:

1. A diode structure for thin-film solar cells, comprising:
   a p-conducting layer comprising a chalcopyrite compound;
   a n-conducting layer having a first band gap and comprising a compound, the compound containing titanium and oxygen, the n-conducting layer adjoining the p-conducting layer;
   a n-conducting amplifying layer having a second band gap; and
   wherein a side of the n-conducting layer facing away from the p-conducting layer adjoins the n-conducting amplifying layer; and
   wherein the second band gap is larger than the first band gap.

2. The diode structure as claimed in claim 1, wherein the chalcopyrite compound is a I-III-VI$_2$ semiconductor from the group Cu(InGa)(SSe)$_2$.

3. The diode structure as claimed in claim 2, wherein the chalcopyrite compound comprises CuInSe$_2$ (CIS).

4. The diode structure as claimed in claim 1, wherein the compound containing titanium and oxygen is selected from a group TiO$_x$ where x is in the range from greater than 1.5 to less than 2.0.

5. The diode structure of claim 1, wherein the n-conduction layer consists essentially of titanium and oxygen.

6. The diode structure as claimed in claim 1, wherein the n-conducting amplifying layer comprises an oxide that is transparent and conductive.

7. The diode structure as claimed in claim 6, wherein the oxide is a doped metal oxide.

8. The diode structure as claimed in claim 7, wherein the oxide comprises any one of ZnO, SnO$_2$ and InSnO$_2$.

9. A thin-film solar cell comprising:
   a diode structure, the diode structure comprising:
      a p-conducting layer comprising a chalcopyrite compound;
      a n-conducting layer having a first band gap and comprising a compound, the compound containing titanium and oxygen, the n-conducting layer adjoining the p-conducting layer;
      a n-conducting amplifying layer having a second band gap; and
      wherein a side of the n-conducting layer facing away from the p-conducting layer adjoins the n-conducting amplifying layer; and
      wherein the second band gap is larger than the first band gap.

10. The thin-film solar cell as claimed in claim 9, wherein a layer thickness of the n-conducting layer is selected based on a sheet resistivity of the n-conducting layer.

11. The thin-film solar cell as claimed in claim 9, wherein a side of the p-conducting layer facing away from the n-conducting layer adjoins a bus contact.

12. The thin-film solar cell as claimed in claim 11, wherein the n-conducting amplifying layer adjoins a substrate, the n-conducting amplifying layer facing away from a light incident side of the substrate.

13. The thin-film solar cell as claimed in claim 11, wherein the bus contact comprises molybdenum.

14. The thin-film solar cell as claimed in claim 11, wherein the bus contact is configured as a full surface area back electrode.

15. The thin-film solar cell as claimed in claim 11, wherein the bus contact adjoins a light incident side of a substrate.

16. The thin-film solar cell as claimed in claim 15, wherein the substrate comprises glass.

* * * * *